(12) United States Patent
Watanabe et al.

(10) Patent No.: US 11,538,893 B2
(45) Date of Patent: Dec. 27, 2022

(54) DISPLAY DEVICE

(71) Applicant: SHARP KABUSHIKI KAISHA, Sakai (JP)

(72) Inventors: Noriko Watanabe, Sakai (JP); Takeshi Yaneda, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 141 days.

(21) Appl. No.: 17/042,830

(22) PCT Filed: Mar. 29, 2018

(86) PCT No.: PCT/JP2018/013259
§ 371 (c)(1),
(2) Date: Sep. 28, 2020

(87) PCT Pub. No.: WO2019/186900
PCT Pub. Date: Oct. 3, 2019

(65) Prior Publication Data
US 2021/0020732 A1 Jan. 21, 2021

(51) Int. Cl.
*H01L 27/32* (2006.01)
*G09G 3/3258* (2016.01)
(Continued)

(52) U.S. Cl.
CPC ...... *H01L 27/3276* (2013.01); *H01L 27/3258* (2013.01); *G09G 3/3258* (2013.01);
(Continued)

(58) Field of Classification Search
CPC ........ H05B 33/22; H05B 33/03; H05B 33/04; H01L 27/3258; H01L 27/3276; H01L 27/3293; H01L 27/3246; H01L 51/5253; H01L 51/5234; H01L 51/5218; H01L 51/0097; H01L 2251/5338; H01L 2227/323; G09F 9/30; G09G 3/3233; G09G 3/3258; G09G 3/3266; G09G 3/3291; G09G 2320/0626; G09G 2300/0861; G09G 2300/0842; G09G 2300/0819;
(Continued)

(56) References Cited

U.S. PATENT DOCUMENTS 8,471,981 B2 * 6/2013 Kim ................. G09G 3/3674
349/151
2015/0035777 A1 2/2015 Hirakata et al.
(Continued)

FOREIGN PATENT DOCUMENTS

JP 2013-109869 A 6/2013
JP 2015-045846 A 3/2015

*Primary Examiner* — Vongsavanh Sengdara
(74) *Attorney, Agent, or Firm* — ScienBiziP, P.C.

(57) ABSTRACT

A display device includes a first display region, a second display region, a curved portion provided between the first display region and the second display region, a plurality of first control lines provided in the first display region and extending in a first direction in which the first display region and the second display region are arranged side by side, and a plurality of second control lines provided in the second display region and extending in the first direction. The first control lines and the second control lines are electrically connected via curved portion wiring lines formed in the curved portion.

19 Claims, 9 Drawing Sheets

(51) Int. Cl.
*G09G 3/3266* (2016.01)
*G09G 3/3291* (2016.01)
*H01L 51/52* (2006.01)

(52) U.S. Cl.
CPC ......... *G09G 3/3266* (2013.01); *G09G 3/3291* (2013.01); *G09G 2300/0421* (2013.01); *G09G 2300/0439* (2013.01); *G09G 2320/0626* (2013.01); *H01L 27/3246* (2013.01); *H01L 51/5218* (2013.01); *H01L 51/5234* (2013.01); *H01L 51/5253* (2013.01); *H01L 2227/323* (2013.01)

(58) Field of Classification Search
CPC .............. G09G 2300/0439; G09G 2300/0426; G09G 2300/0421; Y02E 10/549
See application file for complete search history.

(56) References Cited

U.S. PATENT DOCUMENTS

| | | | |
|---|---|---|---|
| 2015/0161928 A1* | 6/2015 | Kim | G09G 3/3225 345/1.3 |
| 2016/0210916 A1* | 7/2016 | Jeong | G09G 3/3614 |
| 2016/0232852 A1* | 8/2016 | An | G09G 3/3291 |
| 2016/0284272 A1* | 9/2016 | Her | G09G 3/035 |
| 2017/0061882 A1* | 3/2017 | An | G09G 3/3266 |
| 2018/0082632 A1* | 3/2018 | Lee | G09G 3/3233 |
| 2018/0175311 A1* | 6/2018 | Jin | H01L 51/56 |
| 2018/0180961 A1* | 6/2018 | Ha | H01L 27/124 |
| 2019/0041915 A1* | 2/2019 | Park | H01L 27/3276 |

\* cited by examiner

DISPLAY DEVICE

TECHNICAL FIELD

The disclosure relates to a display device.

BACKGROUND ART

A flexible display device has a configuration in which an electro-optical element, together with other circuits or the like that drive the electro-optical element, is sandwiched between a support body that supports these circuits and various function layers.

Such a flexible display device is used as a foldable display device in which a display portion is flexibly deformable, thin, light, and bendable.

Examples of the electro-optical element include an EL element, which is an optical element using electroluminescence (hereinafter referred to as "EL") of a luminescent material. An EL display device using an EL element has attracted attention as a display device having a higher response speed and a wider viewing angle than a liquid crystal display device.

The display device like this includes: a display panel in which a TFT, an optical element such as an organic EL element and a sealing layer covering the optical element are provided on a resin layer (resin film substrate) that is made of polyimide or the like and that includes a barrier layer formed on a surface of the resin layer; and a function film such as a polarizing film or a cover film provided on a surface of the display panel (e.g., see PTL 1).

CITATION LIST

Patent Literature

PTL 1: JP 2013-109869 A (published on Jun. 6, 2013)

SUMMARY

Technical Problem

In a bi-fold flexible display device including spread two screens, when a signal of a scanning signal line and/or a signal of a light emission control line are wired for each screen, these signals may vary between screens, and display luminance of each screen may differ.

The disclosure has been made in view of the above problems, and an object of the disclosure is to provide a flexible display device capable of equalizing display luminance of each screen.

Solution to Problem

In order to solve the above problems, a display device according to one embodiment of the disclosure includes: a first display region and a second display region each including a plurality of optical elements each including a first electrode provided for each pixel, a second electrode provided in common to a plurality of pixels, and a function layer sandwiched between the first electrode and the second electrode; a curved portion provided between the first display region and the second display region; a frame region surrounding the first display region, the second display region, and the curved portion; a terminal portion provided with a terminal of a wiring line; a bending portion provided between the frame region and the terminal portion; and a plurality of pixel circuits corresponding to the plurality of optical elements, where a plurality of first control circuits are formed in the frame region along a side opposite to a side facing the second display region in the first display region, a plurality of second control circuits are formed in the frame region along a side opposite to a side facing the first display region in the second display region, a direction in which the first display region and the second display region are arranged side by side is defined as a first direction, and a direction perpendicular to the first direction is defined as a second direction, in the first display region, a plurality of first control lines extending in the first direction and a plurality of first data signal lines intersecting the plurality of first control lines are provided, in the second display region, a plurality of second control lines extending in the first direction and a plurality of second data signal lines intersecting the plurality of second control lines are provided, the first control circuit outputs a control signal to the first control line, the second control circuit outputs a control signal to the second control line, and the first control line and the second control line are electrically connected to each other via a curved portion wiring line formed in the curved portion.

Advantageous Effects of Disclosure

It is possible to provide a flexible display device that equalizes the display luminance of each screen.

DESCRIPTION OF EMBODIMENTS

First Embodiment

An embodiment of the disclosure will be described below with reference to FIGS. 1 to 6.

Hereinafter, a case where a flexible display device 1 (display device) according to the present embodiment is an organic EL display device including an OLED layer including an organic light emitting diode (OLED) as a light-emitting element (optical element) will be described as an example.

Schematic Configuration of Flexible Display Device

Figure 1:
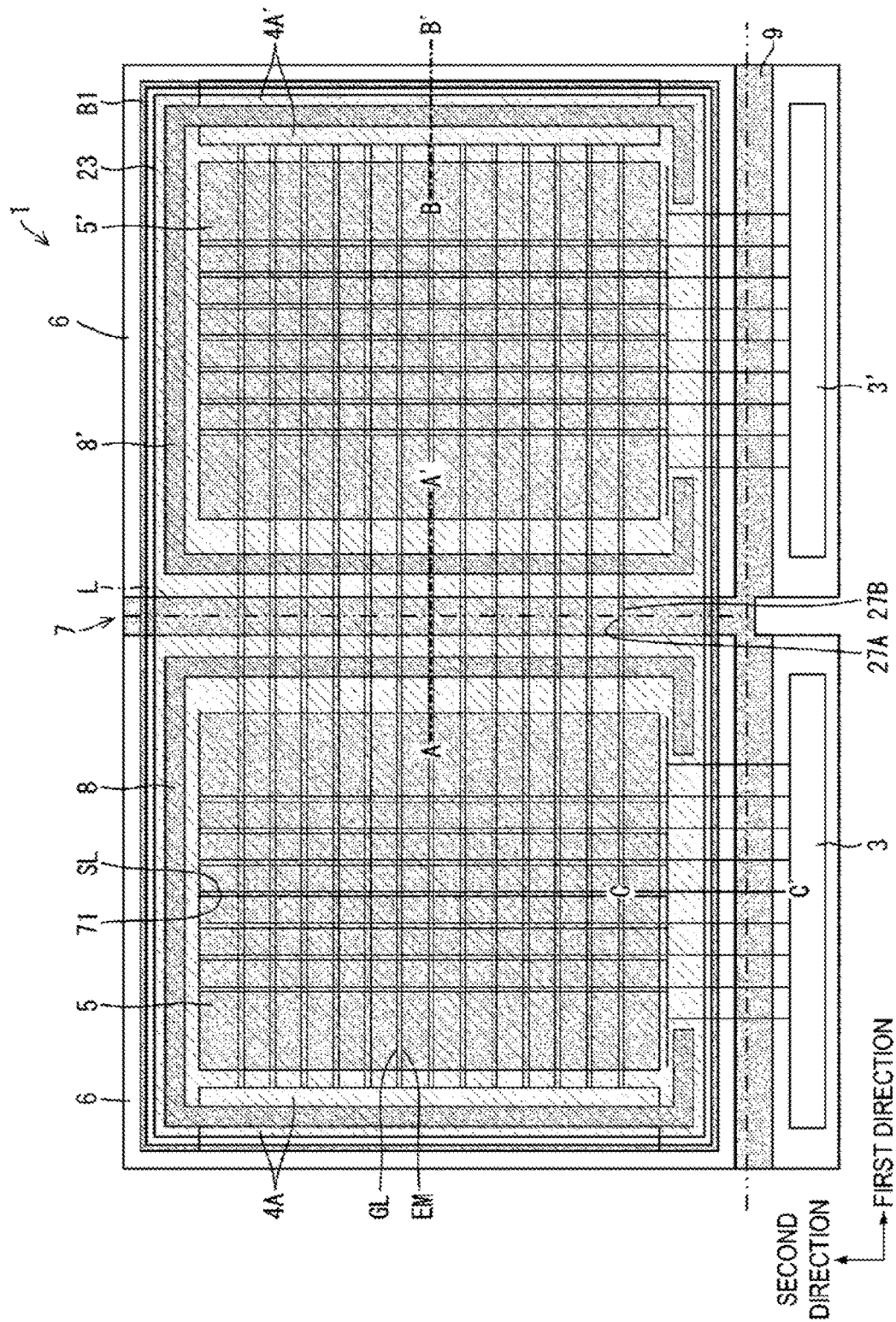
FIG. 1 is a plan view illustrating a schematic configuration of main portions of a flexible display device according to a first embodiment of the disclosure.
Figure 2:
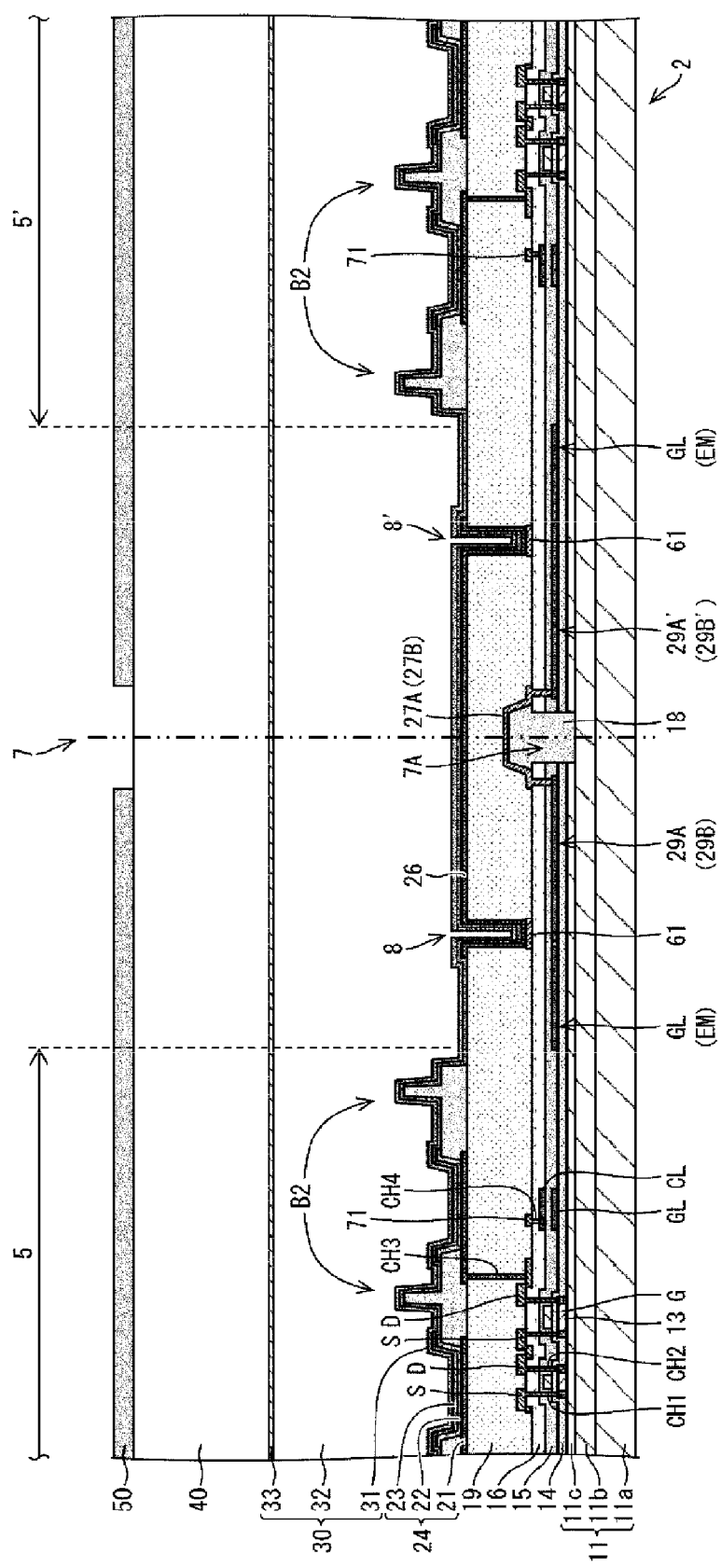
FIG. 2 is a cross-sectional view illustrating a schematic configuration at or near a curved portion of a flexible display device according to the first embodiment of the disclosure.
Figure 3:
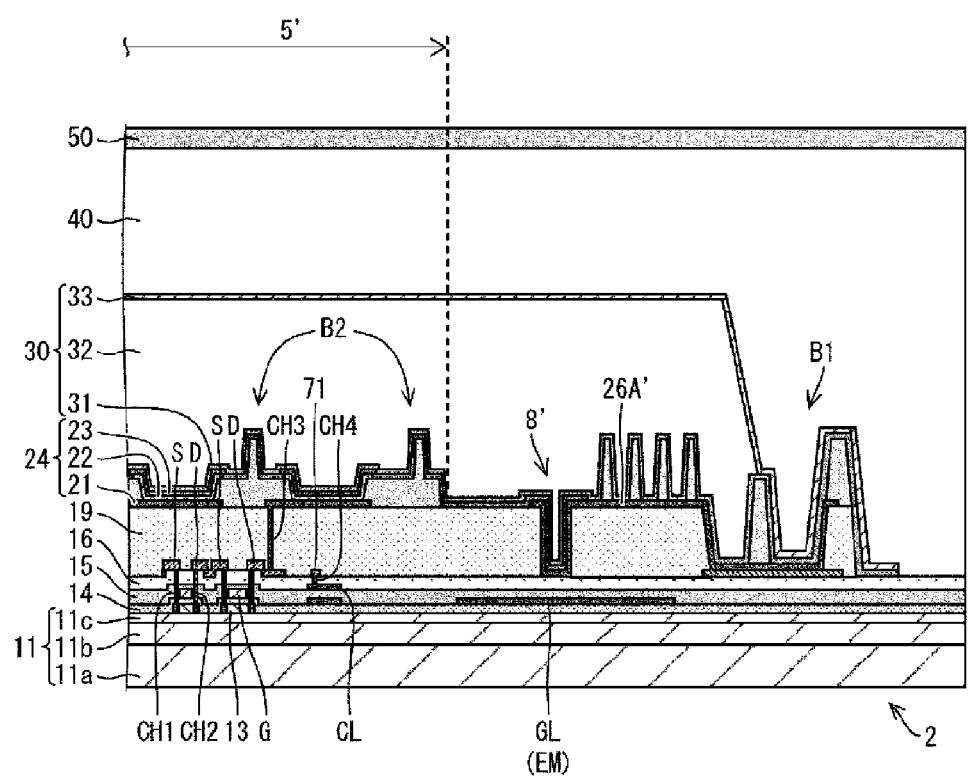
FIG. 3 is a cross-sectional view illustrating a schematic configuration at or near a control circuit of a flexible display device according to the first embodiment of the disclosure.
Figure 4:
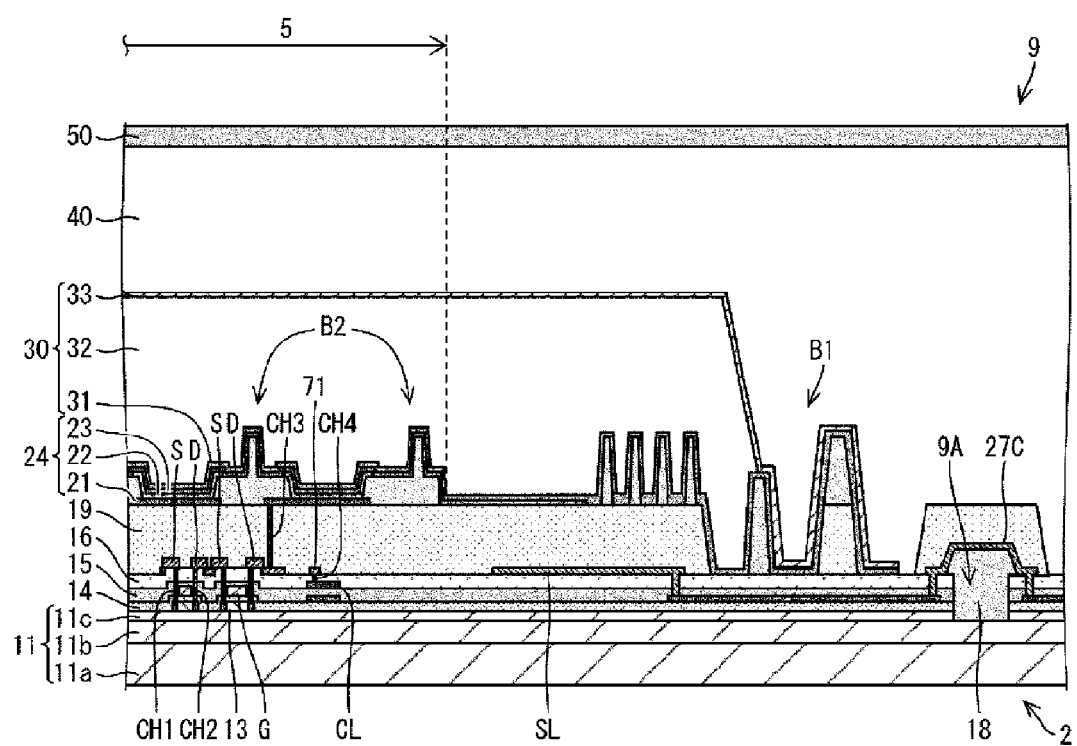
FIG. 4 is a cross-sectional view illustrating a schematic configuration between a first display region and a bending portion of a flexible display device according to the first embodiment of the disclosure.

FIG. 1 is a plan view illustrating a schematic configuration of main portions of the flexible display device 1 according to the present embodiment. FIG. 2 is a cross-sectional view illustrating a schematic configuration at or near a curved portion 7 of the flexible display device 1 according to the present embodiment. FIG. 3 is a cross-sectional view illustrating a schematic configuration at or near a control circuit 4A' of the flexible display device 1 according to the present embodiment. FIG. 4 is a cross-sectional view illustrating a schematic configuration between the first display region 5 and the bending portion 9, of the flexible display device 1 according to the present embodiment. Note that FIG. 2 collectively illustrates a cross-sectional view along the scanning signal line GL and a cross-sectional view along the light emission control line EM. FIG. 3 collectively illustrates a cross-sectional view along the scanning signal line GL and a cross-sectional view along the light emission control line EM. Further, in FIG. 3, the control circuit 4A' is omitted. FIG. 4 corresponds to a cross-sectional view taken along line C-C (a cross-sectional view taken along the data signal line SL) of the flexible display device 1 illustrated in FIG. 1.

The flexible display device 1 is a folding type flexible image display device (foldable display) provided so as to be foldable (bendable) and expandable (extendable). Here, the "expanded state" refers to a state in which the flexible display device 1 is in a state of 180-degree expansion, in other words, refers to a so-called fully flat state in which the flexible display device 1 is made to be flat by being opened.

Hereinafter, a case in which the flexible display device 1 is a bi-fold rectangular display device including two spread screens will be described as an example.

As illustrated in FIG. 1, in a plan view, the flexible display device 1 includes: a first display region 5 (hereinafter simply referred to as "display region 5") and a second display region 5' (hereinafter simply referred to as "display region 5'") constituting each of two spread screens; a curved portion 7 provided between the display region 5 and the display region 5'; a frame region 6 as a peripheral region surrounding the display regions 5, 5' and the curved portion 7; a plurality of first control circuits 4A (hereinafter simply referred to as "control circuits 4A") formed in the frame region 6 along a side opposite to a side facing the display region 5' in the display region 5; a plurality of second control circuits 4A' (hereinafter, simply referred to as "control circuits 4A'") formed in the frame region 6 along a side opposite to a side facing the display region 5 in the display region 5'; terminal portions 3 and 3' in which terminals of the respective wiring lines are formed; and bending portions 9 provided between the display regions 5, 5' and the terminal portions 3, 3'. When the control circuit 4A and the control circuit 4A' are not distinguished from each other, each of them is referred to as "control circuit 4". The term "plan view" refers to, for example, a view of an OLED panel 2 from the upper face side thereof.

Hereinafter, a direction in which the display region 5 and the display region 5' are arranged side by side is referred to as a "first direction", and a direction perpendicular to the first direction is referred to as a "second direction".

The curved portion 7 is a portion that bends the flexible display device 1 and is provided along a line L that extends in a second direction passing through a central portion of each side along the longitudinal direction of the flexible display device 1. The flexible display device 1 has a line-symmetric structure with the line L as an axis.

In the frame region 6, a first trench (depression, recess) 8 (hereinafter, simply referred to as a "trench 8") is formed so as to surround the display region 5 and not to straddle the curved portion 7. However, in a plan view, the trench 8 is formed so as to avoid a portion (i.e., divided) between the display region 5 and the terminal portion 3. This is for passing the data signal line SL extending from the terminal portion 3. Similarly, a second trench 8' (hereinafter, simply referred to as a "trench 8'") is formed so as to surround the display region 5' and not to straddle the curved portion 7. However, in a plan view, the trench 8' is formed so as to avoid a portion (i.e., divided) between the display region 5' and the terminal portion 3'. This is for passing the data signal line SL extending from the terminal portion 3'.

In addition, in the frame region 6, a frame-shaped bank (wall body, bank) B1 straddling the curved portion 7 is formed so as to surround the display regions 5, 5' and the trenches 8, 8'.

The terminal portions 3 and 3' are formed in the frame region 6 at the end portion of the flexible display device 1 in the second direction so as not to overlap the bending portion 9. In FIG. 1, both of the terminal portion 3 corresponding to the display region 5 and the terminal portion 3' corresponding to the display region 5' are formed at the end portion on the same side, but one of them may be formed at the end portion on the opposite side. Alternatively, only the terminal portion 3 or the terminal portion 3' may be formed. The terminal portions 3 and 3' are bonded to a flexible printed circuit (FPC) substrate by an anisotropic conductive film (ACF). The terminal portions 3 and 3' input each signal or reference potential supplied from the display control circuit to the pixel circuit 25.

Pixel Circuit 25

Figure 5:
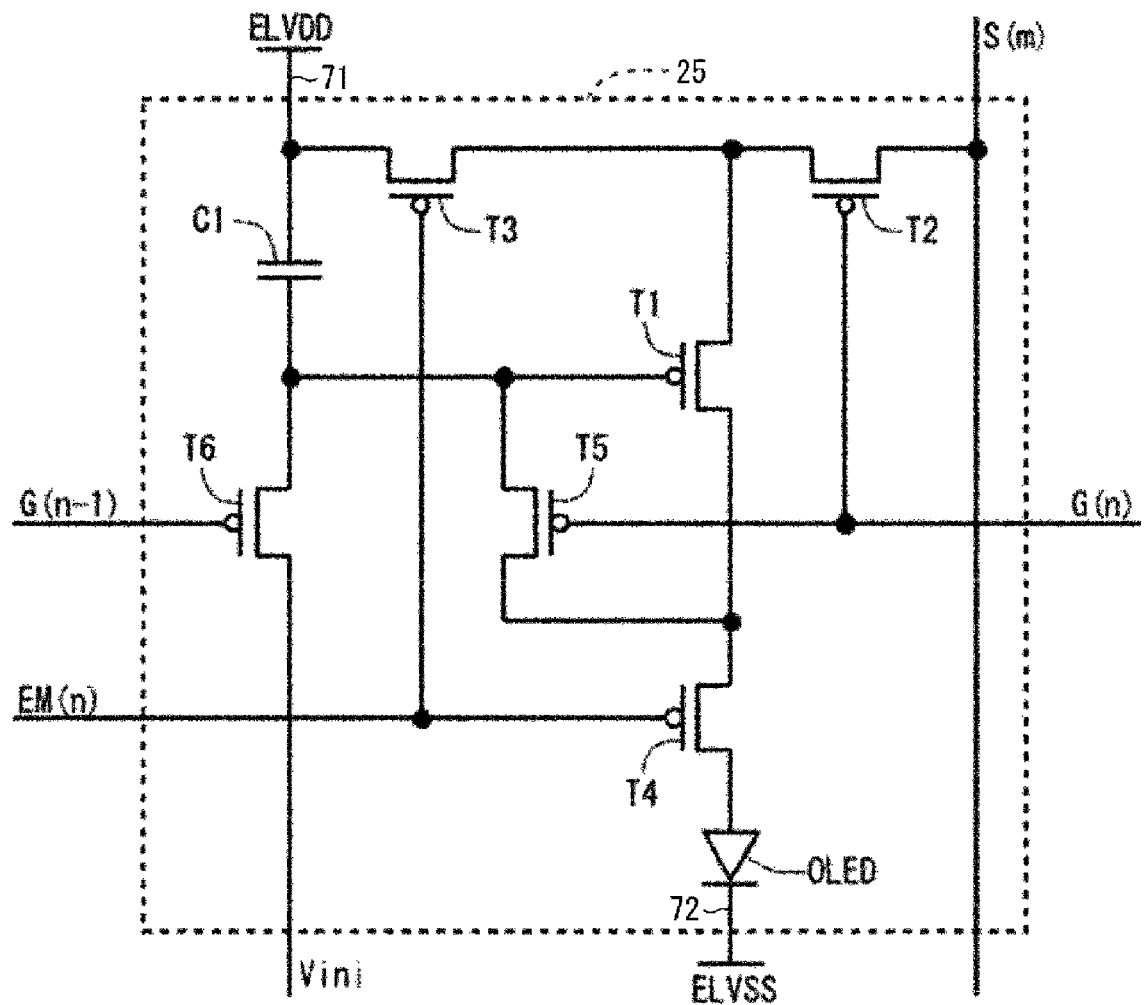
FIG. 5 is a circuit diagram illustrating a configuration of a pixel circuit of a flexible display device according to each embodiment of the disclosure.

The configuration of the pixel circuit 25 formed in the display regions 5 and 5' will be described with reference to FIG. 5. FIG. 5 is a circuit diagram illustrating a configuration of one of the pixel circuits 25 corresponding to m columns and n rows (m and n are natural numbers of one or more). The configuration of the pixel circuit 25 described here is an example, and other known configurations may be also adopted.

The display region 5 is provided with a plurality of scanning signal lines GL(n) (first control lines) extending in a first direction, and a plurality of data signal lines SL(m) (first data signal lines) extending in a second direction orthogonal to the plurality of scanning signal lines GL(n). Similarly, the display region 5' is provided with a plurality of scanning signal lines GL(n) (second control lines) extending in a first direction, and a plurality of data signal lines SL(m) (second data signal lines) extending in a second direction orthogonal to the plurality of scanning signal lines GL(n).

In addition, in the display region 5, a plurality of light emission control lines EM(n) (first control lines), which correspond one-to-one to the scanning signal lines GL(n) and extends in the first direction in parallel with the scanning signal lines GL(n), are provided. Similarly, in the display region 5', a plurality of light emission control lines EM(n) (second control lines), which correspond one-to-one to the scanning signal lines GL(n) and extends in the first direction in parallel with the scanning signal lines GL(n), are provided. The light emission control line EM(n) controls the emission/non-emission timing of each OLED 24.

Scanning control circuits (first control circuit, second control circuit) constituting the control circuit 4 output control signals to the scanning signal lines GL(n). Similarly, the light emission control circuits (first control circuit, second control circuit) constituting the control circuit 4 output control signals to the light emission control line EM(n).

In the display regions 5 and 5', a pixel circuit 25 (subpixel circuit) for driving the OLED 24 is provided so as to correspond to each of intersections of the plurality of scanning signal lines GL(n) and the plurality of data signal lines SL(m). By providing the pixel circuits 25 in this manner, a plurality of pixel matrices are formed in the display regions 5 and 5'. A region partitioned by the scanning signal line GL(n) and the data signal line SL(m) is a pixel 90, and one picture element is formed by a set of pixels 90 of respective colors (e.g., red (R), blue (B), and green (B)).

Additionally, a power source line common to respective pixel circuits 25 is provided in the display regions 5 and 5'. More specifically, a plurality of high-level power supply voltage lines 71 (solid wiring common to a plurality of pixel circuits 25) that supply a high-level power supply voltage (ELVDD) for driving the OLED 24 are provided in the second direction, a plurality of low-level power supply voltage lines 72 that supply a low-level power supply voltage (ELVSS) for driving the OLED 24 are provided in the first direction, and a power source line an initialization voltage Vini is provided. The high-level power supply voltage, the low-level power supply voltage, and the initialization voltage Vini are supplied from a power source circuit (not illustrated). Further, although not illustrated, a plurality of high-level power supply voltage lines 71' arranged in the first direction may be provided. The high-level power supply voltage line 71' arranged in the first direction is electrically connected to the high-level power supply voltage line 71 provided in the second direction.

The pixel circuit 25 includes one OLED 24 and six transistors T1 to T6 (driving transistor T1, writing control transistor T2, power supply control transistor T3, light emission control transistor T4, threshold voltage compensation transistor T5, initialization transistor T6) (simply referred to as "TFT" hereafter) and one capacitor C1. The transistors T1 to T6 are p-channel transistors. The capacitor C1 is a capacitance element including two electrodes (first electrode and second electrode). The pixel circuit 25 illustrated in FIG. 5 is an example and may include an n-channel transistor.

The scanning signal line GL(n) and the light emission control line EM(n) are each connected to a gate driver, and the data signal line SL(m) is connected to a source driver. The gate driver drives the scanning signal line GL(n) and the light emission control line EM(n) based on a control signal such as a clock signal received from the display control circuit. The source driver drives the data signal line SL(m) in accordance with a control signal input from the display control circuit.

The pixel circuit 25 selects a pixel 90 to which a signal is input through the scanning signal line GL(n), determines the amount of charge to be input to the selected pixel 90 through the data signal line SL(m), and supplies a high-level potential from the high-level power supply voltage line 71 to the OLED 24, while a low-level potential is supplied from the low-level power supply voltage line 72 to the OLED 24.

The display control circuit includes an input connector, a timing controller, a power source IC (integrated circuit), or the like, and supplies timing signals such as a gate start pulse signal and a gate clock signal, a power source, an address designation signal or the like, if necessary, to the gate driver, and supplies timing signals such as a source start pulse signal, a source clock signal, and a polarity inversion signal, and gray scale data, a power source, or the like to the source driver.

The gate driver and the source driver may each be formed by one IC chip, or may include a plurality of gate drivers or source drivers each formed by one IC chip. An IC chip including a source driver may include a structure of a gate driver or part of a display control circuit.

In the present specification, the plurality of scanning signal lines GL(n) are simply referred to as "scanning signal lines GL" when they are not distinguished from each other, the plurality of data signal lines SL(m) are simply referred to as "data signal lines SL" when they are not distinguished from each other, and the plurality of light emission control lines EM(n) are simply referred to as "light emission control lines EM" when they are not distinguished from each other.

OLED Panel 2

As illustrated in FIG. 2, the OLED panel 2 has a configuration in which an OLED layer 20 constituting the OLED 24, a sealing film 30, and a cover layer 50 are provided on a TFT (Thin Film Transistor) substrate 10 in this order from the TFT substrate 10 side.

TFT Substrate 10

The TFT substrate 10 includes an insulating support body 11 and a TFT layer 12 provided on the support body 11.

Support Body 11

The support body 11 is a flexible layered film including a resin layer 11b, a barrier layer 11c (moisture-proof layer) provided on the resin layer 11b, and a underlayer film 11a provided on a surface of the resin layer 11b opposite to the barrier layer 11c via an adhesive layer.

In the following description, the underlayer film 11a side of the support body 11 is referred to as the lower side, and the cover layer 50 side is referred to as the upper side.

Examples of the resins used for the resin layer 11b include polyimide, polyethylene, and polyamide, or the like. The resin layer 11b may be replaced with two resin films (e.g., polyimide films) and an inorganic insulating film sandwiched therebetween.

The barrier layer 11c is a layer that prevents moisture and impurities from reaching the TFT layer 12 and the OLED layer 20 formed on the support body 11, and can be formed of, for example, a silicon oxide (SiOx) film, a silicon nitride (SiNx) film, a layered film thereof, or the like formed by a CVD method.

The barrier layer 11c is provided over the entire surface of the resin layer 11b so that the surface of the resin layer 11b is not exposed. Thus, even when resins such as polyimide, which are weak to chemical solution, are used as the resin layer 11b, elution of the resins and process contamination due to the chemical solution can be prevented.

The underlayer film 11a is attached to the lower face of the resin layer 11b from which a carrier substrate such as a glass substrate used for manufacturing the OLED panel 2 has been peeled off, which aims at manufacturing the flexible display device 1 that has sufficient strength even when the resin layer 11b is very thin. As the underlayer film 11a, for example, plastic films made of flexible resins, such as polyethyleneterephthalate, polyethylenenaphthalate, cycloolefin polymer, polyimide, polycarbonate, polyethylene, and aramid, are used.

TFT Layer 12

The TFT layer 12 has a configuration in which a semiconductor layer 13, a layered film 17 (hereinafter, simply referred to as a "layered film 17") in which an inorganic insulating layer and a wiring line layer are repeatedly layered, and an organic insulating film 19 used as a flattening film for flattening a surface of the layered film 17 are provided in this order from below (i.e., from the support body 11 side).

The organic insulating film 19 may be made of, for example, a coatable organic material such as polyimide or acrylic. As described above, the trench 8 is formed in the organic insulating film 19 so as to surround the display region 5, and similarly, the trench 8' is formed so as to surround the display region 5'.

The semiconductor layer 13 is made of, for example, low-temperature polysilicon (LTPS) or an oxide semiconductor (e.g., In—Ga—Zn—O based semiconductor), and is formed in a plurality of island shapes.

The layered film 17 includes a plurality of inorganic insulating layers and a plurality of wiring line layers, and has a structure in which a plurality of inorganic insulating layers and a plurality of wiring line layers are alternately layered. The inorganic insulating layer includes the gate insulating film 14 and the inorganic insulating films 15 and 16, and can be configured by, for example, a silicon oxide (SiOx) film, a silicon nitride (SiNx) film, or a layered film thereof formed by a CVD method. The wiring line layer includes a first metal layer, a second metal layer, and a third metal layer.

The first metal layer includes at least, a plurality of gate electrodes G, a plurality of scanning signal lines GL connected to the plurality of gate electrodes G, and a plurality of light emission control lines EM. The second metal layer includes at least a plurality of capacitance wiring lines CL and a plurality of high-level power supply voltage lines 71' provided in the first direction. The third metal layer includes at least a plurality of source electrodes S, a plurality of data signal lines SL connected to the plurality of source electrodes S, a plurality of drain electrodes D, a plurality of high-level power supply voltage lines 71 arranged in the second direction, and a plurality of low-level power supply voltage lines 72.

A gate insulating film 14 is formed on the support body 11 so as to cover the semiconductor layer 13 formed on the support body 11. A first metal layer is formed on the gate insulating film 14. The first metal layer is covered with an inorganic insulating film 15, and a second metal layer is formed on the inorganic insulating film 15. Further, an inorganic insulating film 16 is formed on the inorganic insulating film 15 so as to cover the second metal layer, and a third metal layer is formed on the inorganic insulating film 16.

The semiconductor layer 13, the gate electrode G, the inorganic insulating films 15 and 16, the source electrode S, and the drain electrode D constitute a TFT. In the present embodiment, the case where the TFT has a top gate structure having the semiconductor layer 13 as a channel is illustrated as an example, but the TFT may have a bottom gate structure.

The source electrode S is connected to the semiconductor layer 13 via a contact hole CH1 provided in the gate insulating film 14 and the inorganic insulating films 15 and 16. The drain electrode D is connected to the semiconductor layer 13 via a contact hole CH2 provided in the gate insulating film 14 and the inorganic insulating films 15 and 16.

The source electrode S is connected to the data signal line SL. The drain electrode D is connected to the first electrode 21 (anode electrode) of the OLED 24 via a contact hole CH3 penetrating the organic insulating film 19. The capacitance wiring line CL is connected to the high-level power supply voltage line 71 via a contact hole CH4 provided in the inorganic insulating film 16.

The high-level power supply voltage line 71 is connected to the high-level power supply circuit portion. The low-level power supply voltage line 72 is connected to a low-level power supply circuit portion.

The high-level power supply voltage line 71 is applied with a high-level potential voltage higher than the low-level potential voltage applied to the second electrode 23 (cathode electrode) of the OLED 24 in order to supply a drive current (light emission current) to the first electrode 21 of the OLED 24 according to the display data.

The high-level power supply voltage line 71 supplies the high-level potential supplied from the high-level power supply circuit portion to each OLED 24. The low-level power supply voltage line 72 supplies the low-level potential supplied from the low-level power supply circuit portion to each OLED 24. Note that the high-level potential and the low-level potential are respectively constant potentials.

The scanning signal line GL in the display region 5 is electrically connected to a lead wiring line 29A which is formed in the same layer as the scanning signal line GL and which extends to the curved portion 7 on the display region 5 side of the trench 8. The lead wiring line 29A is connected via a contact hole to the curved portion wiring line 27A formed in the curved portion 7.

Similarly, the scanning signal line GL in the display region 5' is electrically connected to a lead wiring line 29A' which is formed in the same layer as the scanning signal line GL and which extends to the curved portion 7 on the display region 5' side of the trench 8'. The lead wiring line 29A' is connected via a contact hole to the curved portion wiring line 27A formed in the curved portion 7.

As described above, since both the lead wiring lines 29A and 29A' are connected to the curved portion wiring line 27A, the scanning signal line GL in the display region 5 and the scanning signal line GL in the display region 5' are electrically connected to each other via the curved portion wiring line 27A.

The lead wiring line 29A straddles the lower side of the trench 8, and the trench 8 overlaps the lead wiring line 29A via at least one inorganic film forming the TFT layer 12. Similarly, the lead wiring line 29A' straddles the lower side of the trench 8', and the trench 8' overlaps the lead wiring line 29A' via at least one inorganic film forming the TFT layer 12.

In addition, the light emission control line EM in the display region 5 is electrically connected to a lead wiring line 29B which is formed in the same layer as the light emission control line EM and which extends to the curved portion 7 on the display region 5 side of the trench 8. The lead wiring line 29B is connected via a contact hole to the curved portion wiring line 27B formed in the curved portion 7.

Similarly, the light emission control line EM in the display region 5' is electrically connected to a lead wiring line 29B' which is formed in the same layer as the light emission control line EM and which extends to the curved portion 7 on the display region 5' side of the trench 8'. The lead wiring line 29B' is connected via a contact hole to the curved portion wiring line 27B formed in the curved portion 7.

As described above, since both the lead wiring lines 29B and 29B' are connected to the curved portion wiring line 27B, the light emission control line EM in the display region 5 and the light emission control line EM in the display region 5' are electrically connected to each other via the curved portion wiring line 27B.

The lead wiring line 29B straddles the lower side of the trench 8, and the trench 8 overlaps the lead wiring line 29B via at least one inorganic film forming the TFT layer 12. Similarly, the lead wiring line 29B' straddles the lower side of the trench 8', and the trench 8' overlaps the lead wiring line 29B' via at least one inorganic film forming the TFT layer 12.

In the curved portion 7, a first opening 7A is formed by removing at least one of the inorganic films (the gate insulating film 14, the inorganic insulating films 15 and 16) forming the TFT layer 12, and a first filling film is formed so as to fill the first opening 7A with the flattening film 18. The curved portion wiring lines 27A and 27B are formed, on the first filling film, of the same material in the same layer as the third metal layer.

The bending portion 9 has the same structure as the curved portion 7. As illustrated in FIG. 4, also in the bending portion 9, a second opening 9A is formed by removing at least one of the inorganic films (the gate insulating film 14, the inorganic insulating films 15 and 16) forming the TFT layer 12, and a second filling film is formed so as to fill the second opening 9A with the flattening film 18. A bending portion wiring line 27C is formed on the second filling film. The bending portion wiring line 27C is formed of the same material in the same layer as the curved portion wiring lines 27A and 27B. Signals input to the terminal portions 3 and 3' are input to the pixel circuit 25 from the terminal portions 3 and 3' via the bending portion wiring line 27C.

OLED Layer 20

The OLED layer 20 includes a first electrode 21, an organic EL layer 22 that is formed on the first electrode 21 and that includes an organic layer (function layer) including at least a light-emitting layer, a second electrode 23 formed on the organic EL layer 22, and banks B1 and B2.

The first electrode 21, the organic EL layer 22, and the second electrode 23 constitute a pixel circuit that forms the OLED 24 constituting each pixel 90. In the present embodiment, layers between the first electrode 21 and the second electrode 23 are collectively referred to as organic EL layers 22.

On the second electrode 23, an optical adjustment layer for performing optical adjustment and a protection layer for protecting the second electrode 23 and preventing oxygen and moisture from entering the OLED 24 from the outside may be formed. In the present embodiment, the organic EL layer 22 formed in each pixel 90, the pair of electrode layers (the first electrode 21 and the second electrode 23) sandwiching the organic EL layer 22, and the optical adjustment layer and the protection layer formed as necessary are collectively referred to as the OLED 24.

The first electrode 21 injects (supplies) holes into the organic EL layer 22, and the second electrode 23 injects electrons into the organic EL layer 22. The holes and electrons injected into the organic EL layer 22 are recombined in the organic EL layer 22 to form excitons. The formed excitons emit light when they are deactivated from excited states to ground states, and the emitted light is emitted from the OLED 24 to the outside.

The first electrode 21 is electrically connected to the TFT via a contact hole formed in the organic insulating film 19.

The first electrode 21 is a pattern electrode formed in an island shape for each pixel 90, and is formed, for example, in a matrix shape. On the other hand, the second electrode 23 is a solid-like common electrode common to the pixels 90 in the display regions 5 and 5', and straddles the curved portion 7 in a plan view.

As illustrated in FIG. 2, in the trenches 8 and 8', the second electrode 23 is in contact with the intermediate conductive film 26 formed of the same material in the same layer as the first electrode 21. Further, as illustrated in FIG. 2, in the section between the trench 8 and the trench 8', the second electrode 23 and the intermediate conductive film 26 may be extended while being in contact with each other. That is, the intermediate conductive film 26 may be provided straddling the curved portion 7. As illustrated in FIG. 2, a wiring line 61 formed of the same material in the same layer as the third metal layer may be provided below the trenches 8 and 8'.

As illustrated in FIG. 3, also in the cross-sectional view taken along the line B-B', in the trenches 8 and 8', the second electrode 23 is in contact with the intermediate conductive film 26A' formed of the same material in the same layer as the first electrode 21. Further, as illustrated in FIG. 3, the intermediate conductive film 26A' may be provided so as to extend to the bank Bl. Although the intermediate conductive film 26A' does not necessarily cover the entire third metal layer, it is preferable to cover the end portion of the third metal layer with the intermediate conductive film 26A' in order to prevent penetration of moisture.

In the case where the flexible display device 1 is a top emission type that emits light from the sealing film 30 side, it is preferable that the first electrode 21 be formed of a reflective electrode material formed by layering ITO (Indium Tin Oxide) and Ag (silver) or an alloy containing Ag, and the second electrode 23 be formed of a transparent electrode material such as an MgAg alloy (ultrathin film), ITO, or IZO (Indium Zinc Oxide). Each of the first electrode 21 and the second electrode 23 may be a single layer or may have a layered structure. For example, when the OLED 24 is a top emission type OLED, the first electrode 21 may have a layered structure of a reflective electrode and a transparent electrode.

The bank B1 is an organic layer stopper that defines the edge of the organic layer 32 by blocking the liquid organic material used for the organic layer 32 (in other words, blocking the organic layer 32). The liquid organic material used for the organic layer 32 is likely to stay on the flat portion of the upper face of the bank B1 and is blocked by the flat portion. Therefore, the edge of the organic layer 32 overlaps the upper face (top face) of the bank B1, and the organic layer 32 does not exist outside the frame-shaped bank B1.

The bank B2 functions as an edge cover that prevents electrode concentration and a short circuit with the second electrode 23 due to thinning of the organic EL layer 22 at the peripheral portion of the first electrode 21, and also functions as a pixel separation layer that separates the pixels 90 so that current does not leak to the adjacent pixels 90.

Sealing Film 30

The sealing film 30 is transparent and includes a plurality of inorganic layers arranged to overlap each other and at least one organic layer sandwiched between the plurality of inorganic layers. For example, the sealing film 30 includes a first inorganic layer 31, an organic layer 32, and a second inorganic layer 33, which are layered in this order from the TFT substrate 10 side.

Each of the first inorganic layer 31 and the second inorganic layer 33 is an inorganic insulating film, and can be composed of, for example, a silicon oxide film, a silicon nitride film, a silicon oxynitride film, or a layered film thereof, which are formed by a CVD method. They have a moisture-proof function to prevent moisture from entering and functions as a barrier layer to prevent deterioration of the OLED 24 due to moisture and oxygen.

The organic layer 32 is a transparent organic film and can be made of a coatable organic material such as acrylic. The organic layer 32 is used as a buffer layer (stress relief layer) to relieve the stress of the first inorganic layer 31 and the second inorganic layer 33 having a large film stress, to flatten the surface of the OLED layer 20 in the display regions 5 and 5' by filling a step portion or a foreign matter, to fill a pinhole, and to flatten the underlayer of the second inorganic layer 33, thereby suppressing the generation of cracks in the second inorganic layer 33 when the second inorganic layer 33 is layered.

Each of the first inorganic layer 31 and the second inorganic layer 33 can be composed of, for example, a silicon oxide film, a silicon nitride film, a silicon oxynitride film, or a layered film thereof, which are formed by CVD.

The organic layer 32 is a transparent organic insulating film thicker than the first inorganic layer 31 and the second inorganic layer 33. The organic layer 32 is formed by, for example, applying a liquid organic material onto the first inorganic layer 31 in the display regions 5 and 5' by an ink-jet method or the like, and by curing the liquid organic material. Examples of the organic material include photosensitive resins such as acrylic resins, epoxy resins, and silicone resins. The organic layer 32 can be formed by, for example, applying an ink containing such a photosensitive resin as a liquid organic material onto the first inorganic layer 31 by ink-jet coating and then curing the ink by UV (ultraviolet ray).

Cover Layer 50

A cover layer 50 is provided on the sealing film 30 via an adhesive layer 40. In the present embodiment, the cover layer 50 is provided so as to avoid the curved portion 7 as illustrated in FIG. 2, but the cover layer 50 may be provided so as not to avoid the curved portion 7. A notch may be provided in the cover layer 50 and the adhesive layer 40 in the curved portion 7.

The cover layer 50 includes a function film layer having at least one of a protection function, an optical compensation function, and a touch sensor function. The cover layer 50 may be a protection film that functions as a support body when a carrier substrate such as a glass substrate is peeled off, and may be a hard coat layer such as a hard coat film, or a function film such as a polarizing film and a touch sensor film.

Example of Manufacturing Process

Figure 6:
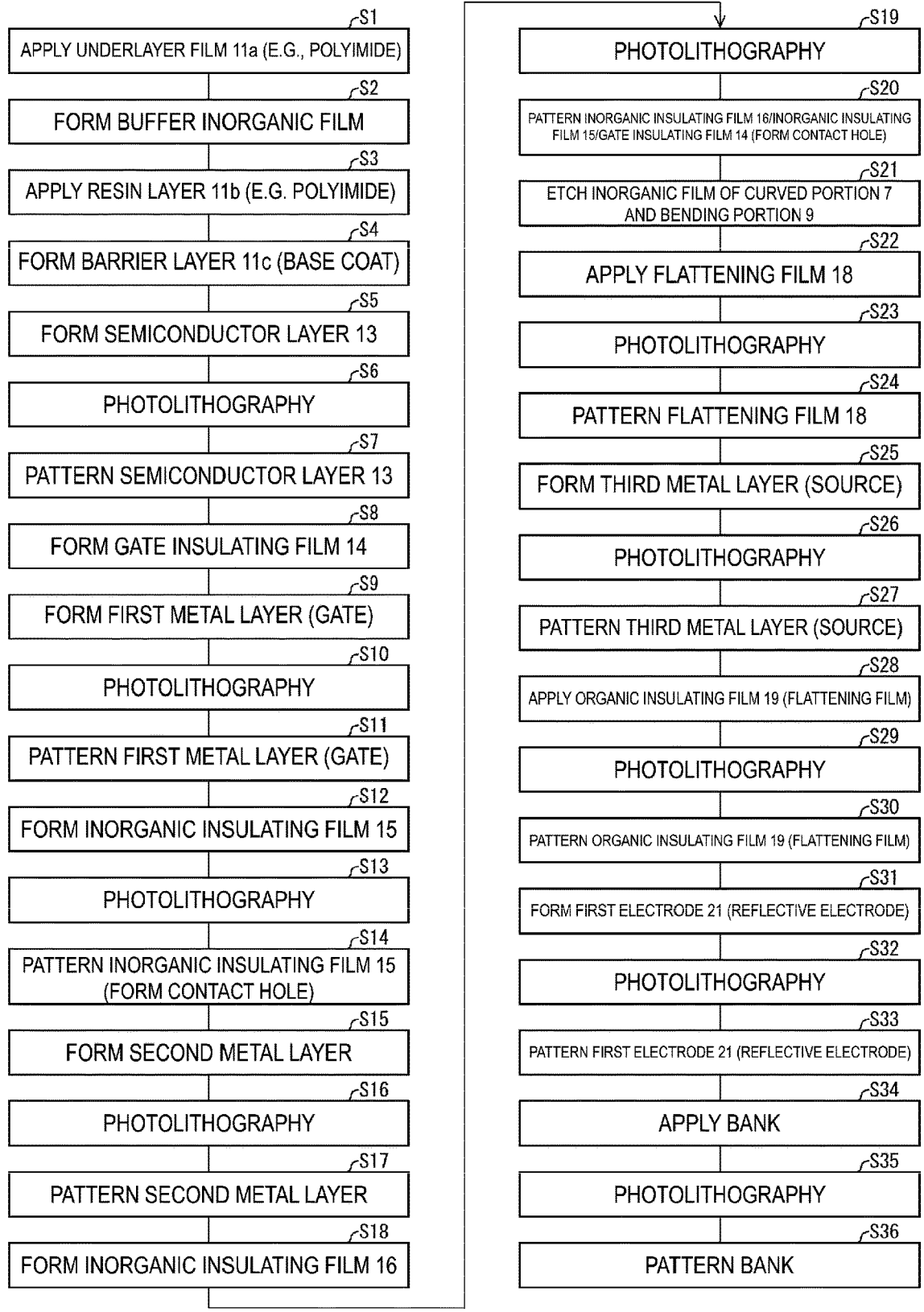
FIG. 6 is a flowchart illustrating an example of a manufacturing process of the flexible display device according to each embodiment of the disclosure.

An example of a manufacturing process of the flexible display device 1 will be described with reference to a flowchart illustrated in FIG. 6.

First, an underlayer film 11a (e.g., polyimide) is applied onto a transparent support substrate (e.g., mother glass) (step S1). Next, a buffer inorganic film (not illustrated) is formed (step S2). Next, a resin layer 11b (e.g., polyimide) is applied (step S3). Next, a barrier layer 11c (base coat) is formed (step S4).

Next, the semiconductor layer 13 is formed (step S5), photolithography is performed (step S6), and the semiconductor layer 13 is patterned (step S7).

Next, the gate insulating film 14 is formed (step S8). Next, a first metal layer (gate) is formed (step S9), photolithography is performed (step S10), and the gate is patterned (step S11).

Next, the inorganic insulating film 15 is formed (step S12), photolithography is performed (step S13), and the inorganic insulating film 15 is patterned (a contact hole is formed) (step S14).

Next, a second metal layer is formed (step S15), photolithography is performed (step S16), and the second metal layer is patterned (step S17).

Next, the inorganic insulating film 16 is formed (step S18), and photolithography is performed (step S19).

Next, the inorganic insulating film 16, the inorganic insulating film 15, and the gate insulating film 14 are patterned (a contact hole is formed) (step S20).

Next, at least one of the inorganic films (the inorganic insulating film 16, the inorganic insulating film 15, and the gate insulating film 14) formed in the curved portion 7 and the bending portion 9 is etched (step S21). Then, the flattening film 18 is applied to the first opening 7A and the second opening 9A formed by the etching (step S22), photolithography is performed (step S23), and the flattening film 18 is patterned (step S24). When the flattening film 18 is photosensitive, it is patterned in step S23.

Next, a third metal layer (source) is formed (step S25), photolithography is performed (step S26), and the third metal layer is patterned (step S27).

Next, an organic insulating film 19 as a flattening film is applied (step S28), photolithography is performed (step S29), and the organic insulating film 19 is patterned (step S30). When the organic insulating film 19 is photosensitive, it is patterned in step S29.

Next, the first electrode 21 (reflective electrode) is formed (step S31), photolithography is performed (step S32), and the first electrode 21 is patterned (step S33).

Finally, a bank is formed (step S34), photolithography is performed (step S35), and the bank is patterned (step S36). When the bank is photosensitive, it is patterned in step S35.

Advantageous Effects

As described above, in the flexible display device 1 according to the present embodiment, the scanning signal lines GL in the display region 5 and the display region 5' are electrically connected to each other via the curved portion 7, and the light emission control lines EM in the display region 5 and the display region 5' are electrically connected to each other via the curved portion 7. Therefore, according to the present embodiment, since it is possible to suppress the signal of the scanning signal lines GL and the signal of the light emission control lines EM from varying between the display regions 5 and 5', it is possible to equalize the display luminance of the display regions 5 and 5'.

Modified Example of First Embodiment

In the first embodiment, (1) the scanning signal lines GL in the display region 5 and the display region 5' are electrically connected to each other via the curved portion 7, and (2) the light emission control lines EM in the display region 5 and the display region 5' are electrically connected to each other via the curved portion 7. However, only one of (1) and (2) may be used. That is, the scanning signal lines GL in the display region 5 and the display region 5' may be electrically connected to each other via the curved portion wiring lines 27A while the light emission control lines EM in the display region 5 and the display region 5' are not electrically connected to each other. Alternatively, the light emission control lines EM in the display region 5 and the display region 5' may be electrically connected to each other via the curved portion wiring lines 27B while the scanning signal lines GL in the display region 5 and the display region 5' are not electrically connected to each other.

Second Embodiment

Another embodiment of the disclosure will be described below with reference to FIGS. 7 to 9. In addition, in the present embodiment, differences from the first embodiment will be described, and members having the same functions as the members described in the first embodiment will be denoted by the same reference signs, and description thereof will be omitted.

Figure 7:
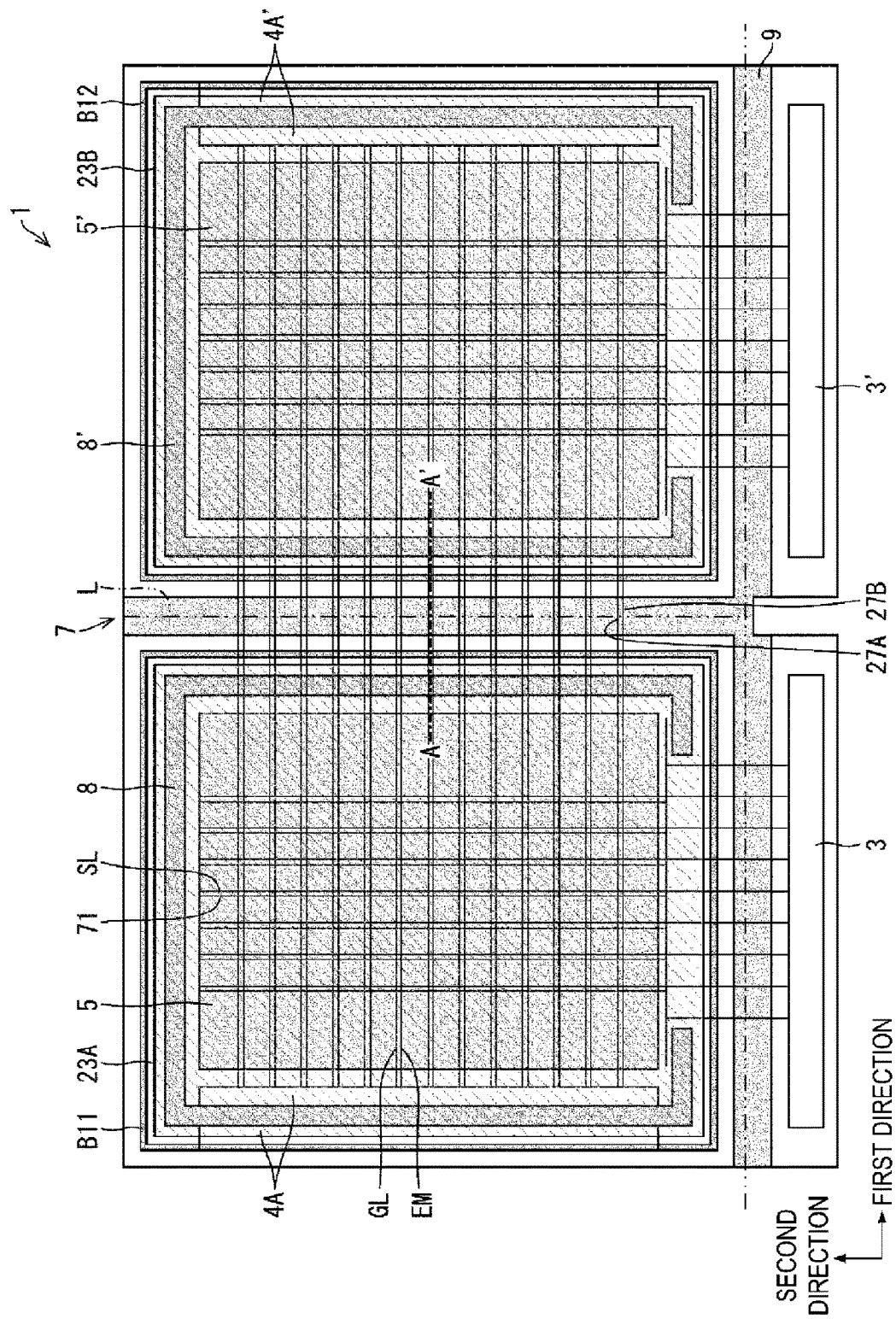
FIG. 7 is a plan view illustrating a schematic configuration of main portions of a flexible display device according to a second embodiment of the disclosure.

FIG. 7 is a plan view illustrating a schematic configuration of main portions of the flexible display device 1 according to the present embodiment. FIG. 8 is a cross-sectional view (cross-sectional view taken along line A-A') corresponding to the control line in FIG. 7. FIG. 9 is a cross-sectional view illustrating that the second electrodes of the display regions 5 and 5' in FIG. 7 are electrically connected.

Differences between the flexible display device 1 according to the present embodiment and the flexible display device 1 according to the first embodiment will be described below.

As illustrated in FIG. 7, the second electrode 23 of the flexible display device 1 of the present embodiment includes a first second electrode 23A that overlaps the display region 5 and that is a solid-like common electrode common to the pixels 90 in the display region 5, and a second second electrode 23B that overlaps the display region 5' and that is a solid-like common electrode common to the pixels 90 in the display region 5'.

In the flexible display device 1 of the present embodiment, a frame-shaped first display bank B11 surrounding the display region 5 and the trench 8 and a frame-shaped second display bank B12 surrounding the display region 5' and the trench 8' are formed. Each of the first display bank B11 and the second display bank B12 is an organic layer stopper that defines the edge of the organic layer 32 (i.e., overlaps the edge) by blocking the liquid organic material used for the organic layer 32 of the sealing film 30 (in other words, blocking the organic layer 32).

Figure 8:
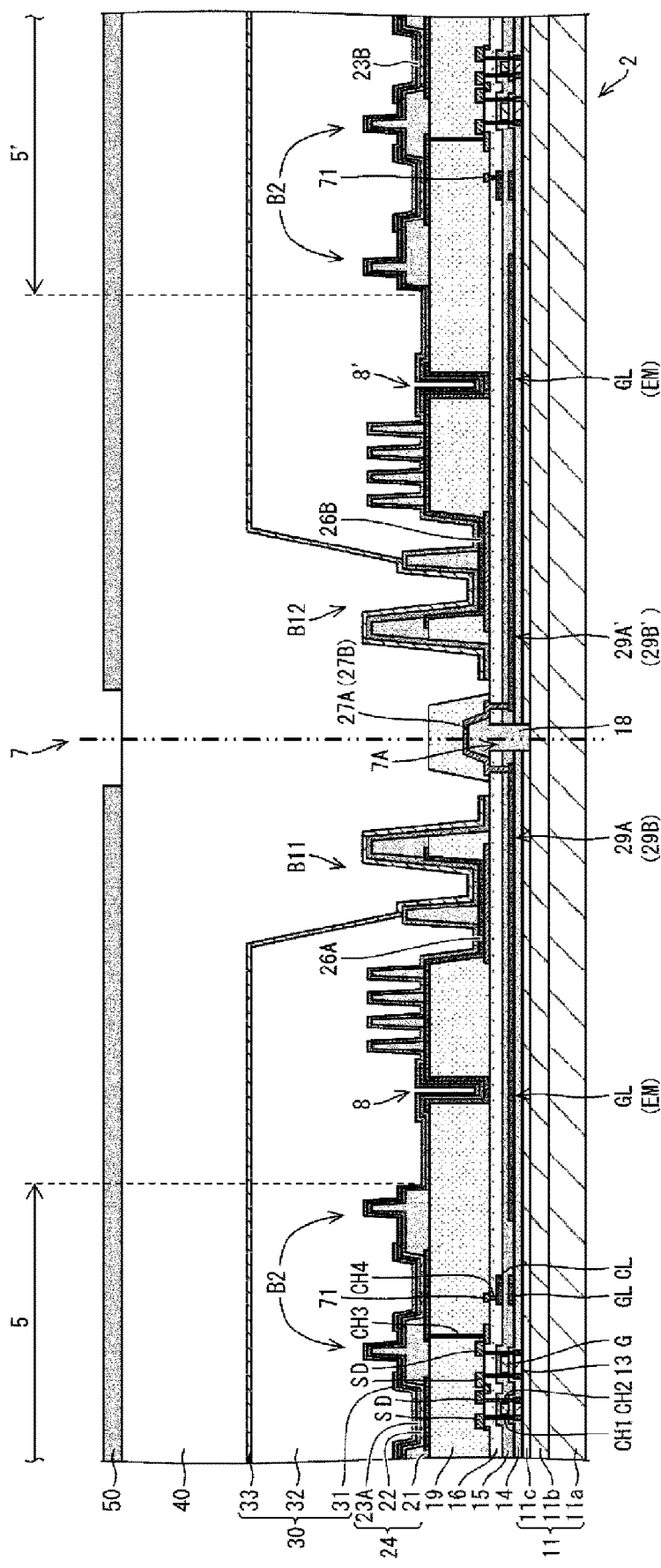
FIG. 8 is a cross-sectional view illustrating a schematic configuration at or near a curved portion of a flexible display device according to the second embodiment of the disclosure.

As illustrated in FIG. 8, also in the present embodiment, the scanning signal line GL in the display region 5 and the scanning signal line GL in the display region 5' are electrically connected to each other via the lead wiring line 29A, the curved portion wiring line 27A, and the lead wiring line 29A', similarly to the first embodiment. Similarly, the light emission control line EM in the display region 5 and the light emission control line EM in the display region 5' are electrically connected to each other via the lead wiring line 29B, the curved portion wiring line 27B, and the lead wiring line 29B'.

As described above, in the present embodiment, the second electrode 23 and the bank are individually provided in each of the display region 5 and the display region 5'. As for the scanning signal lines GL and the light emission control lines EM, as in first embodiment, the scanning signal lines GL in the display region 5 and the display region 5' are electrically connected to each other via the curved portion 7, and the light emission control lines EM in the display region 5 and the display region 5' are electrically connected to each other via the curved portion 7. Therefore, the display luminance of the display regions 5 and 5' can be equalized regardless of the configuration of the second electrode 23 and the bank.

Figure 9:
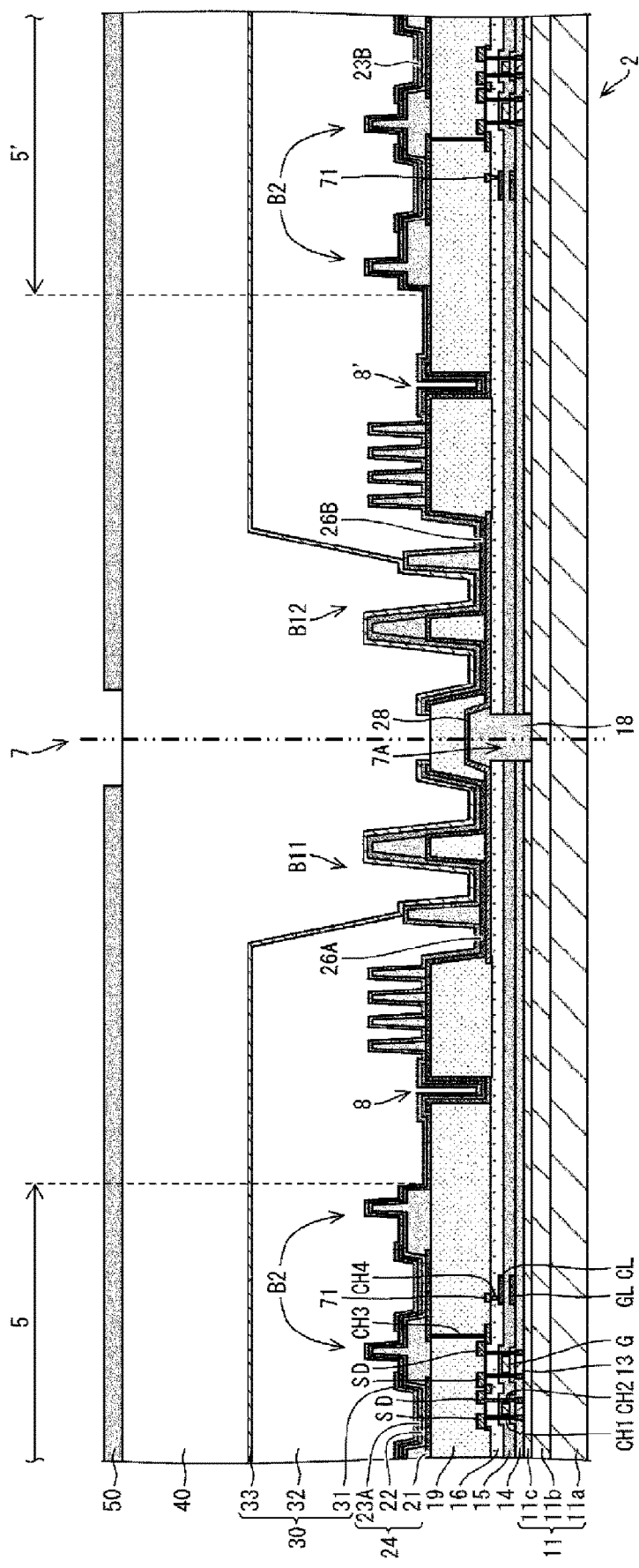
FIG. 9 is a cross-sectional view illustrating another schematic configuration at or near the curved portion of the flexible display device according to the second embodiment of the disclosure.

As illustrated in FIG. 9, also in the present embodiment, similarly to the first embodiment, in the trench 8, the second electrode 23A is in contact with the intermediate conductive film 26A formed of the same material in the same layer as the first electrode 21, and similarly, in the trench 8', the second electrode 23B is in contact with the intermediate conductive film 26B formed of the same material in the same layer as the first electrode 21. The intermediate conductive film 26A extends to the end portion of the curved portion 7 and is electrically connected to the curved portion conductive layer 28 formed in the curved portion 7. Similarly, the intermediate conductive film 26B extends to the end portion of the curved portion 7 and is electrically connected to the curved portion conductive layer 28. Accordingly, the first second electrode 23A and the second second electrode 23B are electrically connected to each other via the curved portion conductive layer 28.

The curved portion conductive layer 28 is formed of the same material in the same layer as the curved portion wiring lines 27A and 27B. The intermediate conductive films 26A and 26B are covered with the first inorganic layer 31 and the second inorganic layer 33 for protection.

Each of the intermediate conductive films 26A and 26B only needs to extend to at least the end of the curved portion 7, and does not need to extend over the entire curved portion 7. This is because it is sufficient to prevent moisture from penetrating from the end portion of the curved portion conductive layer 28.

In the curved portion 7, the curved portion wiring lines 27A, 27B and the curved portion conductive layer 28 are formed adjacent to each other and separated from each other. However, in order to prevent leakage due to the residue of the metallic material at the time of patterning the curved portion wiring lines 27A, 27B and the curved portion conductive layer 28, for example, the curved portion wiring lines 27A and 27B may be concentrated near the center of the curved portion 7 so that the curved portion wiring lines 27A and 27B are adjacent to each other, and the curved portion conductive layer 28 may be disposed near the upper end and the lower end of the curved portion 7.

First Modified Example of Second Embodiment

In the second embodiment, the example including the first second electrode 23A common to the display region 5 and the second second electrode 23B common to the display region 5' has been described. However, instead of this, similar to the first embodiment, the second electrode 23 common to the display regions 5 and 5' may be provided so as to straddle the curved portion 7.

Second Modified Example of Second Embodiment

In the second embodiment, as in the first embodiment, the cover layer 50 may be provided without avoiding the curved portion 7.

First Modified Example of Each Embodiment

In each of the embodiments, the flexible display device 1 is a bi-fold rectangular display device, and the display region is divided into two display regions 5 and 5' by the curved portion 7. However, each embodiment is not limited thereto. The flexible display device 1 may be a three-fold display in which two curved portions 7 are provided along the shorthand direction so as to divide each side along the longitudinal direction of the flexible display device 1 into three equal portions, so that the display region is divided into three by the curved portions 7. Further, the flexible display device 1 may be a multi-fold display having four or more folds.

Second Modified Example of Each Embodiment

In each embodiment, the flexible display device 1 including the OLED 24 has been described as an example of the display device. However, the flexible display device 1 according to each embodiment is not particularly limited as long as it is a display device including a flexible and bendable optical element. Examples of the optical element include an electro-optical element whose luminance and transmittance are controlled by a current and an electro-optical element whose luminance and transmittance are controlled by a voltage, or the like. Examples of the display panel (display device) include an EL display such as an organic EL display with OLED element and an inorganic EL display with inorganic light emitting diode element (inorganic EL element), and a QLED display with QLED (Quantum-dot Light Emitting Diode) element, or the like. The OLED element, the inorganic light emitting diode element, and the QLED element are light-emitting elements, and for example, luminance and transmittance are controlled by a current.

When the light-emitting element is a QLED, holes and electrons are recombined in the light-emitting layer by a drive current between the first electrode 21 and the second electrode 23, and light (fluorescence) is emitted in a process in which excitons, generated in the process of recombination, transition from a conduction band to a valence band of the quantum dot.

Supplement

A flexible display device 1 according to an aspect 1 of the disclosure includes: a first display region 5 and a second display region 5' each including a plurality of OLEDs 24 (optical elements) each including a first electrode 21 provided for each pixel 90, a second electrode 23 provided in common to a plurality of pixels 90, and a function layer sandwiched between the first electrode 21 and the second electrode 23; a curved portion 7 provided between the first display region 5 and the second display region 5'; a frame region 6 surrounding the first display region 5, the second display region 5', and the curved portion 7; a terminal portions 3 and 3' provided with a terminal of a wiring line; a bending portion 9 provided between the frame region 6 and the terminal portions 3 and 3'; and a plurality of pixel circuits 25 corresponding to the plurality of optical elements, where a plurality of first control circuits 4A are formed in the frame region 6 along a side opposite to a side facing the second display region 5' in the first display region 5, a plurality of second control circuits 4A' are formed in the frame region 6 along a side opposite to a side facing the first display region 5 in the second display region 5', a direction in which the first display region 5 and the second display region 5' are arranged side by side is defined as a first direction, and a direction perpendicular to the first direction is defined as a second direction, in the first display region 5, a plurality of first control lines (scanning signal lines GL or light emission control lines EM) extending in the first direction and a plurality of first data signal lines SL intersecting the plurality of first control lines are provided, in the second display region 5', a plurality of second control lines (scanning signal lines GL or light emission control lines EM) extending in the first direction and a plurality of second data signal lines SL intersecting the plurality of second control lines are provided, the first control circuit 4A outputs a control signal to the first control line, the second control circuit 4A' outputs a control signal to the second control line, and the first control line and the second control line are electrically connected to each other via a curved portion wiring line 27A and 27B formed in the curved portion 7.

In the flexible display device 1 according to an aspect 2 of the disclosure, in the aspect 1, in the curved portion 7, a first opening 7A is formed in at least one inorganic film forming a thin film transistor (TFT) layer 12 in the curved portion, a first filling film is formed to fill the first opening 7A, and the curved portion wiring line 27A and 27B may be formed on the first filling film.

In the flexible display device 1 according to aspect 3 of the disclosure, in the aspect 1 or 2, the first control circuit 4A and the second control circuit 4A' may be scanning control circuits, and the first control line and the second control line may be scanning signal lines GL.

In the flexible display device 1 according to an aspect 4 of the disclosure, in the aspect 1 or 2, the first control circuit 4A and the second control circuit 4A' may be light emission control circuits, and the first control line and the second control line may be light emission control lines EM.

In the flexible display device 1 according to an aspect 5 of the disclosure, in any one of the aspects 1 to 4, the second electrode 23 may be provided to be common to the first display region 5 and the second display region 5', and may be provided to straddle the curved portion 7.

In the flexible display device 1 according to an aspect 6 of the disclosure, in any one of the aspects 1 to 4, the second electrode 23 may be configured by a first second electrode 23A and a second second electrode 23B, the first second electrode 23A may overlap the first display region 5, the second second electrode 23B may overlap the second display region 5', and the first second electrode 23A and the second second electrode 23B may be electrically connected to each other via a curved portion conductive layer 28 that is formed in the curved portion 7 and that is formed of the same material in the same layer as the curved portion wiring lines 27A and 27B.

In the flexible display device 1 according to an aspect 7 of the disclosure, in the aspect 2, the flattening film forming the TFT layer 12 may be provided with a first trench 8 and a second trench 8' to surround the first display region 5 and the second display region 5', and in the first trench 8 and the second trench 8', the second electrode 23 may be in contact with an intermediate conductive film 26 formed of the same material in the same layer as the first electrode 21.

In the flexible display device 1 according to an aspect 8 of the disclosure, in the aspect 7, the first trench 8 and the second trench 8' between the first display region 5 and the second display region 5' may overlap lead wiring lines 29A, 29A', 29B, and 29B' electrically connecting the first control line and the second control line via an inorganic film forming the TFT layer 12.

In the flexible display device 1 according to an aspect 9 of the disclosure, in the aspect 7 or 8, the first trench 8 may be formed to avoid a portion between the terminal portion 3 and the first display region 5.

In the flexible display device 1 according to an aspect 10 of the disclosure, in any one of the aspects 1 to 9, the terminal portions 3, 3' are formed at end portions of the flexible display device 1 in the second direction, a bending portion 9 is provided between the first display region 5 and the terminal portion 3, a second opening 9A is formed in at least one inorganic film forming the TFT layer 12 in the bending portion 9, a second filling film is formed to fill the second opening 9A, and a signal input to the terminal portion 3 is input to the pixel circuit 25 via the bending portion wiring lines 27C formed on the second filling film and formed of the same material in the same layer as the curved portion wiring lines 27A, 27B.

The flexible display device 1 according to an aspect 11 of the disclosure, in any one of the aspects 1 to 10, may further include a sealing film 30 configured to seal the plurality of optical elements, where the sealing film 30 may include a plurality of inorganic layers disposed to overlap each other and at least one organic layer 32 interposed between the plurality of inorganic layers.

In the flexible display device 1 according to an aspect 12 of the disclosure, in the aspect 11, a frame-shaped bank B1 overlapping an edge of the organic layer 32 may be provided straddling the curved portion 7 to surround the first display region 5 and the second display region 5'.

The flexible display device 1 according to an aspect 13 of the disclosure may include, in the aspect 11, an adhesive layer 40 provided on the sealing film 30 and a cover layer 50 provided on the adhesive layer 40 and including a function film layer, where the adhesive layer 40 and the cover layer 50 may be provided to avoid the curved portion 7 in a plan view.

In the flexible display device 1 according to an aspect 14 of the disclosure, in the aspect 11, a frame-shaped first display bank B11 overlapping an edge of the organic layer 32 may be provided to surround the first display region 5, and a frame-shaped second display bank B12 overlapping an edge of the organic layer 32 may be provided to surround the second display region 5'.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A display device comprising:
a first display region and a second display region each including a plurality of optical elements, each of the plurality of optical elements including:
a first electrode provided for each of a plurality of pixels;
a second electrode provided in common to the plurality of pixels;
a function layer sandwiched between the first electrode and the second electrode;
a curved portion provided between the first display region and the second display region;
a frame region surrounding the first display region, the second display region, and the curved portion;
a terminal portion provided with a terminal of a wiring line;
a bending portion provided between the frame region and the terminal portion; and
a plurality of pixel circuits corresponding to the plurality of optical elements,
wherein a plurality of first control circuits are formed in the frame region along a side opposite to a side facing the second display region in the first display region,
a plurality of second control circuits are formed in the frame region along a side opposite to a side facing the first display region in the second display region,
a direction in which the first display region and the second display region are arranged side by side is defined as a first direction, and a direction perpendicular to the first direction is defined as a second direction,
in the first display region, a plurality of first control lines extending in the first direction and a plurality of first data signal lines intersecting the plurality of first control lines are provided,
in the second display region, a plurality of second control lines extending in the first direction and a plurality of second data signal lines intersecting the plurality of second control lines are provided,
at least one of the plurality of first control circuits outputs a control signal to each of the plurality of first control lines,
at least one of the plurality of second control circuits outputs a control signal to each of the plurality of second control lines, and
at least one of the plurality of first control lines and at least one of the plurality of second control lines are electrically connected to each other via a curved portion wiring line formed in the curved portion,
wherein a first opening is formed in at least one inorganic film forming a thin film transistor (TFT) layer in the curved portion,
a first filling film is formed to fill the first opening,
the curved portion wiring line is formed on the first filling film,
a flattening film forming the TFT layer is provided with a first trench and a second trench to surround the first display region and the second display region, and
in the first trench and the second trench, the second electrode is in contact with an intermediate conductive film formed of the same material in the same layer as the first electrode.

2. The display device according to claim 1,
wherein the at least one first control circuit and the at least one second control circuit are scanning control circuits, and
the at least one first control line and the at least one second control line are scanning signal lines.

3. The display device according to claim 1,
wherein the at least one first control circuit and the at least one second control circuit are light emission control circuits, and
the at least one first control line and the at least one second control line are light emission control lines.

4. The display device according to claim 1,
wherein the second electrode is provided to be common to the first display region and the second display region, and is provided to straddle the curved portion.

5. The display device according to claim 1,
wherein the first trench and the second trench between the first display region and the second display region overlap a lead wiring line electrically connecting the at least one first control line and the at least one second control line via the at least one inorganic film forming the TFT layer.

6. The display device according to claim 1,
wherein the first trench is formed to avoid a portion between the terminal portion and the first display region.

7. The display device according to claim 1, further comprising a sealing film configured to seal the plurality of optical elements,
wherein the sealing film includes a plurality of inorganic layers disposed to overlap each other and at least one organic layer interposed between the plurality of inorganic layers.

8. The display device according to claim 7,
wherein a frame-shaped bank overlapping an edge of the at least one organic layer is provided straddling the curved portion to surround the first display region and the second display region.

9. The display device according to claim 7, further comprising:
an adhesive layer provided on the sealing film; and
a cover layer provided on the adhesive layer and including a function film layer,
wherein the adhesive layer and the cover layer are provided to avoid the curved portion in a plan view.

10. A display device comprising:
a first display region and a second display region each including a plurality of optical elements, each of the plurality of optical elements including:
a first electrode provided for each of a plurality of pixels;
a second electrode provided in common to the plurality of pixels;
a function layer sandwiched between the first electrode and the second electrode;
a curved portion provided between the first display region and the second display region;
a frame region surrounding the first display region, the second display region, and the curved portion;
a terminal portion provided with a terminal of a wiring line;
a bending portion provided between the frame region and the terminal portion; and
a plurality of pixel circuits corresponding to the plurality of optical elements,
wherein a plurality of first control circuits are formed in the frame region along a side opposite to a side facing the second display region in the first display region,
a plurality of second control circuits are formed in the frame region along a side opposite to a side facing the first display region in the second display region,
a direction in which the first display region and the second display region are arranged side by side is defined as a first direction, and a direction perpendicular to the first direction is defined as a second direction,
in the first display region, a plurality of first control lines extending in the first direction and a plurality of first data signal lines intersecting the plurality of first control lines are provided,
in the second display region, a plurality of second control lines extending in the first direction and a plurality of second data signal lines intersecting the plurality of second control lines are provided,
at least one of the plurality of first control circuits outputs a control signal to each of the plurality of first control lines,
at least one of the plurality of second control circuits outputs a control signal to each of the plurality of second control lines,
at least one of the plurality of first control lines and at least one of the plurality of second control lines are electrically connected to each other via a curved portion wiring line formed in the curved portion,
wherein a first opening is formed in at least one inorganic film forming a thin film transistor (TFT) layer in the curved portion,
a first filling film is formed to fill the first opening,
the curved portion wiring line is formed on the first filling film,
the terminal portion is formed at an end portion of the display device in the second direction,
the bending portion is provided between the first display region and the terminal portion,
a second opening is formed in the at least one inorganic film forming the TFT layer in the bending portion,
a second filling film is formed to fill the second opening, and
a signal input to the terminal portion is input to the pixel circuit via a bending portion wiring line that is formed on the second filling film and that is formed of the same material in the same layer as the curved portion wiring line.

11. The display device according to claim 10,
wherein the at least one first control circuit and the at least one second control circuit are scanning control circuits, and
the at least one first control line and the at least one second control line are scanning signal lines.

12. The display device according to claim 10,
wherein the at least one first control circuit and the at least one second control circuit are light emission control circuits, and
the at least one first control line and the at least one second control line are light emission control lines.

13. The display device according to claim 10,
wherein the second electrode is provided to be common to the first display region and the second display region, and is provided to straddle the curved portion.

14. The display device according to claim 10,
wherein a flattening film forming the TFT layer is provided with a first trench and a second trench to surround the first display region and the second display region, and
in the first trench and the second trench, the second electrode is in contact with an intermediate conductive film formed of the same material in the same layer as the first electrode.

15. The display device according to claim 14,
wherein the first trench and the second trench between the first display region and the second display region overlap a lead wiring line electrically connecting the at least one first control line and the at least one second control line via the at least one inorganic film forming the TFT layer.

16. The display device according to claim 14,
wherein the first trench is formed to avoid a portion between the terminal portion and the first display region.

17. The display device according to claim 10, further comprising a sealing film configured to seal the plurality of optical elements,
wherein the sealing film includes a plurality of inorganic layers disposed to overlap each other and at least one organic layer interposed between the plurality of inorganic layers.

18. The display device according to claim 17,
wherein a frame-shaped bank overlapping an edge of the at least one organic layer is provided straddling the curved portion to surround the first display region and the second display region.

19. The display device according to claim 17, further comprising:
an adhesive layer provided on the sealing film; and
a cover layer provided on the adhesive layer and including a function film layer,
wherein the adhesive layer and the cover layer are provided to avoid the curved portion in a plan view.

* * * * *